(12) United States Patent
Hamanaka et al.

(10) Patent No.: US 8,704,556 B2
(45) Date of Patent: Apr. 22, 2014

(54) INTEGRATED CIRCUIT-BASED DRIVE CIRCUIT FOR DRIVING VOLTAGE-CONTROLLED SWITCHING DEVICE AND METHOD OF MANUFACTURING THE DRIVE CIRCUIT

(75) Inventors: Yoshiyuki Hamanaka, Kariya (JP); Tsuneo Maebara, Nagoya (JP); Junichi Nagata, Okazaki (JP); Tomoyuki Muraho, Nagoya (JP); Akito Itou, Kariya (JP)

(73) Assignee: Denso Corporation, Kariya (JP)

( * ) Notice: Subject to any disclaimer, the term of this patent is extended or adjusted under 35 U.S.C. 154(b) by 202 days.

(21) Appl. No.: 13/324,153

(22) Filed: Dec. 13, 2011

(65) Prior Publication Data
US 2012/0146613 A1 Jun. 14, 2012

(30) Foreign Application Priority Data

Dec. 14, 2010 (JP) ................................ 2010-278342

(51) Int. Cl.
*H03K 3/00* (2006.01)
(52) U.S. Cl.
USPC .......................................................... 327/109
(58) Field of Classification Search
None
See application file for complete search history.

(56) References Cited

U.S. PATENT DOCUMENTS

| | | | | |
|---|---|---|---|---|
| 5,625,312 | A * | 4/1997 | Kawakami et al. | 327/483 |
| 5,764,088 | A * | 6/1998 | Lavieville et al. | 327/110 |
| 6,774,682 | B2 * | 8/2004 | Theobald et al. | 327/110 |
| 7,746,158 | B2 | 6/2010 | Morishita et al. | |
| 8,102,687 | B2 * | 1/2012 | Takasu et al. | 363/132 |
| 8,120,390 | B1 * | 2/2012 | Mack | 327/108 |
| 8,284,575 | B2 * | 10/2012 | Inamura et al. | 363/55 |
| 8,350,601 | B2 * | 1/2013 | Nagata et al. | 327/109 |
| 8,497,728 | B2 * | 7/2013 | Mizobe et al. | 327/427 |
| 8,531,212 | B2 * | 9/2013 | Dewa et al. | 327/109 |
| 2009/0002054 | A1 | 1/2009 | Tsunoda et al. | |
| 2012/0025875 | A1 * | 2/2012 | Fukuta et al. | 327/109 |
| 2012/0075761 | A1 * | 3/2012 | Miura et al. | 361/93.1 |
| 2012/0293218 | A1 * | 11/2012 | Dewa et al. | 327/109 |

FOREIGN PATENT DOCUMENTS

| | | |
|---|---|---|
| CN | 101171739 | 4/2008 |
| JP | 2006-320087 | 11/2006 |
| JP | 2009-011049 | 1/2009 |

OTHER PUBLICATIONS

Office Action (2 pages) dated Dec. 21, 2012, issued in corresponding Japanese Application No. 2010-278342 and English translation (2 pages).
Office Action (5 pgs.) dated Jan. 6, 2014, issued in corresponding Chinese Office Action No. 201110417369.9 with an at least partial English-language translation thereof (8 pgs.).

* cited by examiner

*Primary Examiner* — Lincoln Donovan
*Assistant Examiner* — Khareem E Almo
(74) *Attorney, Agent, or Firm* — Nixon & Vanderhye P.C.

(57) ABSTRACT

A drive circuit supplies a charging current via a charging path to drive the control terminal of a voltage-controlled switching device, with a resistor and a switching device being connected in series in the charging path. A control circuit in an integrated circuit of the drive circuit operates an internal switching device such as to selectively enable/interrupt the charging current and to regulate the voltage drop across the resistor to a fixed value. The switching device connected in the charging path can be readily changed from the internal switching device to an external switching device, in accordance with the operating requirements of the driven switching device.

18 Claims, 9 Drawing Sheets

INTEGRATED CIRCUIT-BASED DRIVE CIRCUIT FOR DRIVING VOLTAGE-CONTROLLED SWITCHING DEVICE AND METHOD OF MANUFACTURING THE DRIVE CIRCUIT

CROSS-REFERENCE TO RELATED APPLICATIONS

This application is based on and incorporates herein by reference Japanese Patent Application No. 2010-278342 filed on 14 Dec. 2010.

BACKGROUND OF THE INVENTION

1. Field of Application

The present invention relates to a drive circuit incorporating an integrated circuit, for driving a voltage-controlled type of switching device. The invention further relates to a method of manufacturing such a drive circuit.

2. Description of Related Art

A type of drive circuit is known, for example as described in Japanese patent publication No. 2009-11049, for driving a voltage-controlled switching device such as an insulated-gate type of transistor, in which the drive circuit includes a stabilized-current circuit for supplying a constant current as a charging current to a control terminal (e.g., gate) of the driven switching device. The term "charging" is used here in a general sense, for referring to a charging current (positive-direction current) for increasing an amount of positive charge or a discharging current (negative-direction current) for decreasing an amount of positive charge. In recent years, as integrated circuits have become increasingly more compact and lower in cost, it has become possible to incorporate the functions of such a drive circuit in an integrated circuit. In that case, it is necessary that the required level of charging current (determined by the switching speed of the driven switching device) is within the supply current rating of the integrated circuit. It is also necessary to limit the switching frequency such that the rated maximum operating temperature of the integrated circuit is not exceeded.

Hence in the prior art, for wide applicability, it has been necessary for such an integrated circuit to be capable of providing the highest drive current that might be required from the drive circuit, and capable of operating at the highest switching frequency that might be required.

Thus, obtaining such generality of manufacture will result in the integrated circuit being large in scale and expensive to manufacture, and having capabilities which are excessive in relation to usual application requirements, since only a small proportion of such drive circuits must drive switching devices having an extremely high switching speed or operating at an extremely high switching frequency.

SUMMARY

Hence it is desired to overcome the above problem by providing a drive circuit incorporating an integrated circuit, for driving a voltage-control type of switching device such as an insulated-gate type of transistor, whereby the drive circuit can readily be applied to driving switching devices for use over a wide range of switching speed and/or switching frequency. The disclosure further provides a method of configuring such a drive circuit.

From a first aspect, the drive circuit includes a resistor and an external switching device (e.g., MOS FET) connected in series in a charging path, through which a charging current is supplied to a control terminal (e.g., gate) of the driven voltage-control switching device. The integrated circuit includes an internal switching device (e.g., MOS FET) which is connected in a Darlington configuration to the external switching device, and a control circuit (stabilized-current circuit) which applies a control signal to the control terminal of the internal switching device for regulating a voltage drop across the resistor to a predetermined value. The value of the charging current (drive current) supplied by the drive circuit is thereby regulated to a predetermined value.

Here, the term "internal switching device" or "external switching device" refers to a device such as a field effect transistor whereby a level of current flow between input and output terminals (source and drain electrodes) can be varied, or the current interrupted, by a control signal applied to a control terminal (gate) of the device.

The charging current can thereby be supplied via the external switching device, with the level of that current being determined by the control signal which is produced by the control circuit.

However if the external switching device is not required, the drive circuit can readily be configured such that internal switching device is connected in the charging current path, and has an output terminal connected directly to the control terminal of the driven switching device.

The charging current can thereby be regulated to a predetermined value, and on/off operation of the driven switching element controlled, in the same manner (i.e., without changing internal parameters of the integrated circuit) irrespective of whether or not the external switching device is used.

As used in the above, "charging current" does not specify positive or negative polarities, and can signify a (positive) current which supplies a positive charge amount, or a (negative) discharge current which reduces a (positive) charge amount.

From another aspect, when an external switching device is utilized to pass the charging current and the charging current drives the control terminal of the driven switching device to a positive charge, an output terminal of the internal switching device may be connected to an output terminal of the driven switching device. Alternatively, the output terminal of the internal switching device may be connected to an output terminal of the external switching device, for thereby enabling positive charge supplied from the internal switching device to be effectively used in charging the control terminal of the driven switching device.

From another aspect, at least a part of the resistor may be disposed outside the integrated circuit. The advantage of this is as follows. If the resistor is formed internally in the integrated circuit, it would be necessary to adjust an internal parameter (such as a reference voltage value) of the control circuit if the values of charging/discharging current are to be altered, e.g., when a change is made to using an external switching device. With the present disclosure, by locating all or part of the resistor outside the integrated circuit, the resistance value can be readily adjusted to obtain a required value of charging current.

From another aspect, the integrated circuit can incorporate a changeover circuit which is responsive to an externally supplied command signal, applied to an input terminal of the integrated circuit, for enabling the drive circuit configuration to be readily changed between first and second connection conditions. In the first condition, the charging path is established via an internal switching device of the integrated circuit, which is controlled by a control circuit of the integrated circuit. In the second connection condition, the charging path is established via an external switching device (when connected to the integrated circuit), with the external switching device being controlled directly from an output terminal of the control circuit of the integrated circuit.

Since the changeover circuit can be operated by an external command signal supplied to the integrated circuit, control for selecting the first or the second of the above connection conditions can be readily performed.

An external input terminal of the integrated circuit may be dedicated to a changeover operation signal, expressing commands for operating the changeover circuit.

Alternatively, the integrated circuit may include a changeover operation circuit which judges a changeover command based on the state of a predetermined signal (other than a dedicated changeover operation signal) that is supplied externally to the integrated circuit.

For example, the value of a power supply voltage applied to a power supply input terminal of the integrated circuit may set in accordance with whether or not an external switching device is to be utilized, and in that case the power supply voltage value can be detected by the changeover operation circuit as a command signal. The number of required external input terminals of the integrated circuit can thereby be minimized.

The disclosure further provides a method of manufacturing such a drive circuit, comprising steps of:

forming an internal switching device and a control circuit in the integrated circuit, with the control circuit connected to control the internal switching device;

judging whether or not the charging current is to be transferred through a charging path via the internal switching device, the judgement being based upon application requirements of the driven switching device;

when it is judged that the charging current is not to be transferred via the internal switching device, connecting the external switching device within the charging path and connecting a control terminal of an external switching device to an output terminal of the internal switching device, to be thereby controlled by the control circuit of the integrated circuit acting via the internal switching device; and when it is judged that the charging current is to be transferred via the internal switching device, connecting the internal switching device within the charging path.

DESCRIPTION OF PREFERRED EMBODIMENTS

Figure 1:
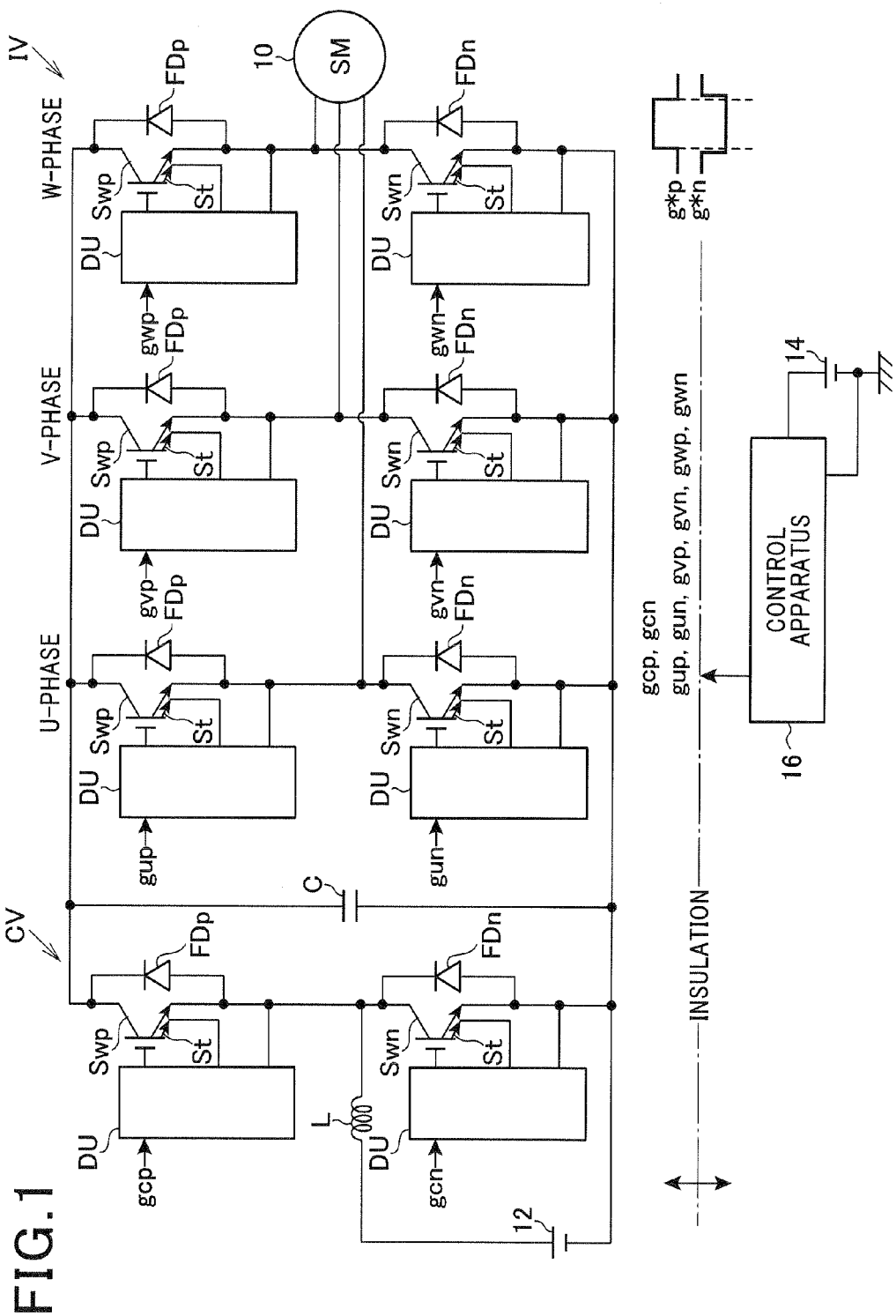
FIG. 1 shows the overall configuration of a system incorporating a first embodiment of a drive unit.

A first embodiment of a drive circuit will be described referring to the drawings. This embodiment is applicable for example to a power supply system of a hybrid motor vehicle.

FIG. 1 is a diagram showing the system configuration. This incorporates drive units DU each configured in accordance with the first embodiment. The system is formed of a inverter IV having six drive units, which drives a 3-phase AC motor-generator 10 of the vehicle, and a converter CV having two drive units, which supplies a DC power voltage to the inverter IV. The converter CV is powered by a high-voltage battery 12, which has a terminal voltage of at least 100 V. The inverter IV has three phase arms (U, V and W phases) which are connected in parallel and are respectively connected to the motor-generator 10, with each arm containing a high-voltage side switching device Swp and a low-voltage side switching device Swn which are connected in series. The junction between the switching devices Swp and Swn of each phase arm of the inverter IV is connected to the corresponding phase of the motor-generator 10. Each of the switching devices of this embodiment is an IGBT (insulated gate bipolar field-effect transistor), i.e., is a voltage-controlled switching device, with the gate terminal of the transistor being the control terminal of the switching device.

The converter CV contains a high-voltage side switching device Swp and a low-voltage side switching device Swn which are connected in series, with the junction between the switching devices Swp and Swn being connected to the high-voltage battery 12 via an inductor L.

A high-voltage side freewheel diode FDp is connected between the collector and emitter of each high-voltage side switching device Swp, and a low-voltage side freewheel diode FDn is connected between the collector and emitter of each low-voltage side switching device Swn.

Each drive unit DU is connected to the control terminal (gate) of the corresponding one of the switching devices Swp, Swn. In the following, these switching devices are designated collectively as Sw#, where "#" signifies "p" or "n". Each of the switching device Sw# are driven by operating signals produced from a control apparatus 16, which operates from a low-voltage battery 14. Based on signals obtained from various sensors (not shown in the drawings), the control apparatus 16 generates drive operation signals gup, gyp, gwp which are applied to respective drive units DU of the switching devices Swp of the U, V and W phase arms of the inverter IV, for operating these switching devices via the corresponding drive units, and drive operation signals gun, gvn, gwn which are applied to respective drive units DU of the switching devices Swn of the U, V and W phase arms of the inverter IV, for operating these switching devices via the corresponding drive units. In addition, the control apparatus 16 supplies drive operation signals gcp and gcn to the respective drive units DU of the switching devices Swp and Swn of the converter CV, for operating these switching devices via the corresponding drive units.

As indicated in FIG. 1, the apparatus has a high-voltage system which includes the inverter IV and the converter CV, and a low-voltage system which includes the control apparatus 16. The high-voltage system and low-voltage system are electrically isolated from one another by means of insulating devices such as photo-couplers (not shown in the drawings), through which operating signals are supplied to the high-voltage system from the low-voltage system.

Each of the switching device Sw# is an IGBT having a sense terminal St from which a minute current flows, with a value proportional to that of the current flow between the input and output terminals (emitter and collector) of the switching device Sw#.

Figure 2:
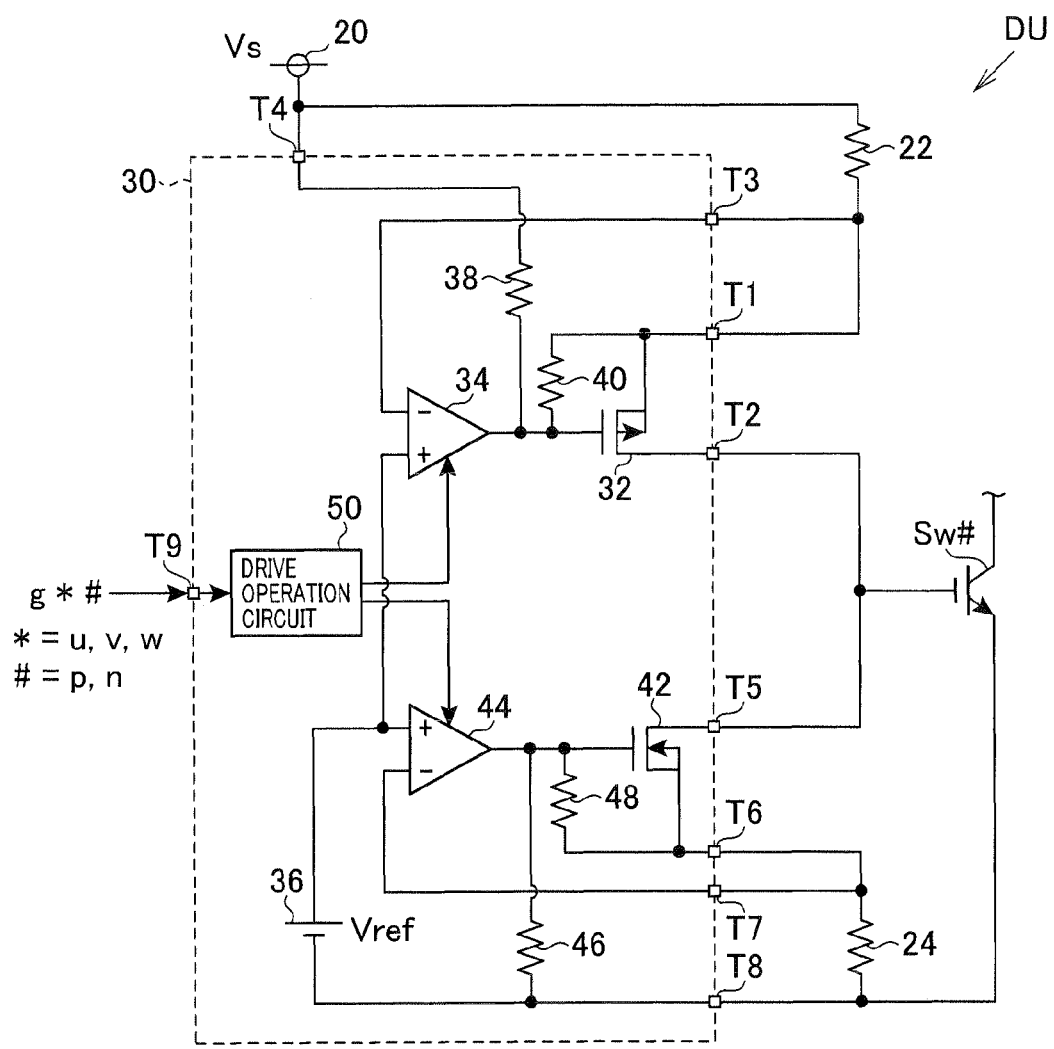
FIG. 2 is a circuit diagram of the first embodiment, configured without external switching devices.

FIG. 2 shows the circuit configuration of each drive unit DU of this embodiment. As shown, the drive unit DU is based on an integrated circuit, designated as the drive IC 30, which is supplied with power from a DC power source 20. With this embodiment, each DC power source 20 is configured as a flyback converter (not shown in the drawings) which operates from voltage of the low-voltage battery 14 as input voltage, with the output side of the flyback converter being connected to provide a supply voltage Vs of a drive unit DU. The output voltage from the flyback converter is preferably regulated to a required value by a series regulator. The voltage of the DC power source 20 is positive with respect to a common reference potential of the drive unit DU, i.e., with respect to the emitter of the switching device Sw# which is driven by that drive unit.

As shown, the drive IC 30 of this embodiment includes a set of external terminals T1 to T9, operational amplifiers 34 and 44, an internal switching device 32 (P-channel MOS FET), an internal switching device 42 (N-channel MOS FET), a drive control circuit 50 which receives a drive operation signal g*# (*=u, v, w, c; #=p, n), and a reference voltage source 36 producing a reference voltage Vref. The drive control circuit 50 produces operation control signals which set the operational amplifier 34 in a functioning and a non-functioning condition respectively in accordance with the drive operation signal g*# designating a switch-on and switch-off command for the driven switching device switching device Sw#, and set the operational amplifier 44 in a functioning and a non-functioning condition respectively, in accordance with the drive operation signal g*# designating a switch-off and switch-on command for the driven switching device Sw#. The emitter of the driven switching device Sw# is connected to the common reference potential of the drive circuit via terminal T8 of the IC 30. The DC power source 20 is connected via a resistor 22 and a terminal T1 to the input terminal (source) of the internal switching device 32.

While the drive operation signal g*# designates a switch-on command (i.e., while the operational amplifier 34 is functioning), a control (voltage) signal is applied to the gate of the switching device 32 by the operational amplifier 34, whose non-inverting input terminal is connected to receive the reference voltage Vref. The reference voltage Vref is positive with respect to the common reference potential and lower than the supply voltage Vs of the DC power source 20. The supply voltage Vs is also applied via a resistor 22 and the terminal T3 to the inverting input terminal of the operational amplifier 34. A stabilized-current circuit is thereby formed by the operational amplifier 34 and switching device 32 in which the control signal applied from the output terminal of the operational amplifier 34 to the gate of the switching device 32 regulates the voltage drop across the resistor 22 to a predetermined constant value (equal to the power supply voltage Vs minus the reference voltage Vref). A constant current (positive charging current) thereby flows through a charging path via the resistor 22 and the switching device 32 to the gate of the driven switching device Sw#.

The output terminal of the operational amplifier 34 is connected to the DC power source 20 via an erroneous operation prevention resistor 38 and terminal T4. While the drive operation signal g*# designates a switch-off command (i.e., while functioning of the operational amplifier 34 is halted by the drive control circuit 50), the gate of the switching device 32 is pulled up to the supply voltage potential Vs via the resistor 38, thereby interrupting the flow of current through the charging path via the switching device 32.

A protection resistor 40 is connected between the gate and source terminals of the switching device 32, for preventing application of a voltage that is higher than the gate-to-source withstanding voltage.

The gate of the driven switching device Sw# is also connected via terminal T5 to the drain of the internal switching device 42. The source of the switching device 42 is connected via terminal T6 and a resistor 24 to the emitter of the driven switching device Sw#.

The non-inverting input terminal of the operational amplifier 44 is connected to the reference voltage Vref, while the non-inverting input terminal of the operational amplifier 44 is connected via the terminal T7 to the junction of the resistor 24 and the source of the switching device 42. While the drive operation signal g*# designates a switch-off command (i.e., while functioning of the operational amplifier 44 is enabled by the drive control circuit 50) a control signal is applied by the operational amplifier 44 to the gate of the switching device 42, whereby the voltage drop across the resistor 24 is held constant, (equal to the reference voltage Vref). A stabilized-current circuit is thus formed by the operational amplifier 44 and switching device 42, whereby a stabilized value of discharging current flows through a charging path via the switching device 42 and the resistor 24, from the gate of the switching device Sw#.

While the drive operation signal g*# designates a switch-on command (i.e., while functioning of the operational amplifier 44 is inhibited by the drive control circuit 50) the output terminal of the operational amplifier 44 is pulled down to the common reference potential via an erroneous operation prevention resistor 46, thereby interrupting current flow through the switching device 42. A protection resistor 48 is connected between the gate and source terminals of the switching device 42, for preventing application of a voltage that is higher than the gate-to-source withstanding voltage of the switching device 42.

The resistors 22 and 24 of a drive unit DU are disposed external to the drive IC 30 in order to enable the drive IC 30 to be made more compact and to have greater generality of application, since the values of charging and discharging current can be readily adjusted by adjusting the resistors 22 and 24.

Figure 3:
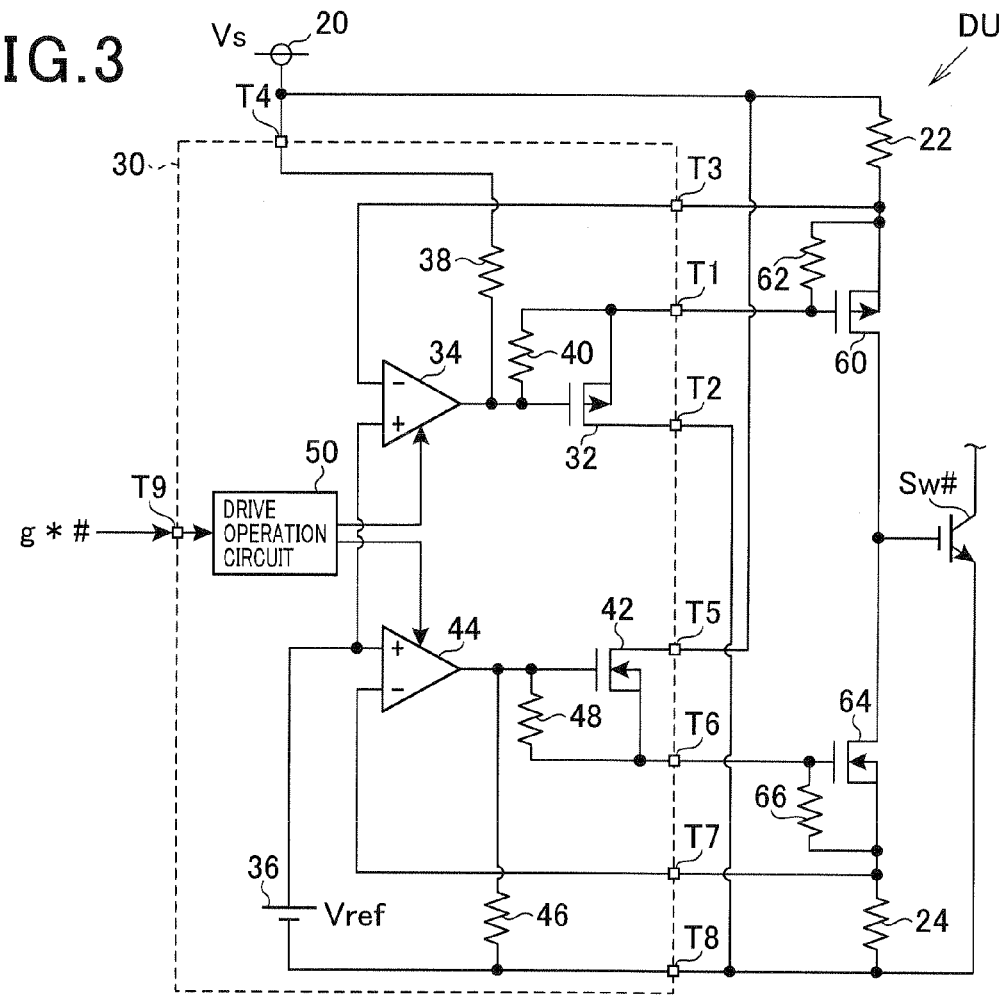
FIG. 3 is a circuit diagram of the first embodiment, configured to incorporate external switching devices respectively connected in charging paths.

With the circuit configuration shown in FIG. 2, the overall size of the drive IC 30 basically depends upon the rated capabilities of the switching devices 32 and 42, i.e., upon the maximum levels of charge/discharge current that can be supplied via the switching devices 32 and 42, and the maximum permissible amount of heat that can be generated by these switching devices. With this embodiment, if it is necessary to drive a switching device Sw# at a higher speed of switching or a higher frequency of switching operations than is allowable with the circuit configuration of FIG. 2, external switching devices can be connected to the drive IC 30 for passing the charging/discharging currents to the gate of the switching device Sw#. In that case, the drive circuit is configured as shown in FIG. 3

Here, the output terminal (source) of the internal switching device 32 is connected to the control terminal (gate) of a first external switching device (P-channel MOS FET) 60 via terminal T1 of the drive IC 30, while the source of the internal switching device 42 is similarly connected to the gate of a second external switching device (N-channel MOS FET) 64 via terminal T6. The source of the switching device 60 is connected via the resistor 22 to the supply voltage Vs of the DC power source 20, and the drain of the switching device 60 is connected to the gate of the switching device Sw#. The drain of the switching device 32 is connected via the terminal T2 to the output terminal (emitter) of the switching device Sw#, i.e., to the common reference potential. The junction between the resistor 22 and the source of the external switching device 60 is connected via terminal T3 to the inverting input terminal of the operational amplifier 34.

With this circuit, each of the pairs of switching devices (FETs) 32, 60 and 42, 64 is connected in a Darlington configuration. A stabilized-current circuit is formed by the operational amplifier 32 and switching devices 32 and 60, whereby a control signal from the output terminal of the operational amplifier 34 applied to the gate of the switching device 32 regulates the voltage drop across the resistor 22 to a predetermined value (Vs minus Vref). A predetermined constant value of charging current is thereby passed through a charging path via the switching device 60 to the gate of the switching device Sw#.

The gate of the external switching device 64 is connected via terminal T6 to the source of the switching device 42, while the source of the switching device 64 is connected via the resistor 24 to the emitter of the driven switching device Sw# (i.e., to the common reference potential), and the drain of the switching device 64 is connected to the gate of the switching device Sw#. The drain of the switching device 42 is connected to the voltage Vs of the DC power source 20 via terminal T5.

While the operational amplifier 44 is functioning, a control signal from the output terminal of the operational amplifier 44 is applied to the gate of the switching device 42 and hence to the gate of the switching device 64, causing the voltage drop across the resistor 24 to be fixed at a predetermined value (Vref). A predetermined value of discharge current thus passes through a charging path via the switching device 64 and resistor 24 from the gate of the switching device Sw#.

A protective resistor 62 is connected between the gate and source of the switching device 60, and a protective resistor 66 is connected between the gate and source of the switching device 64.

Figure 4:
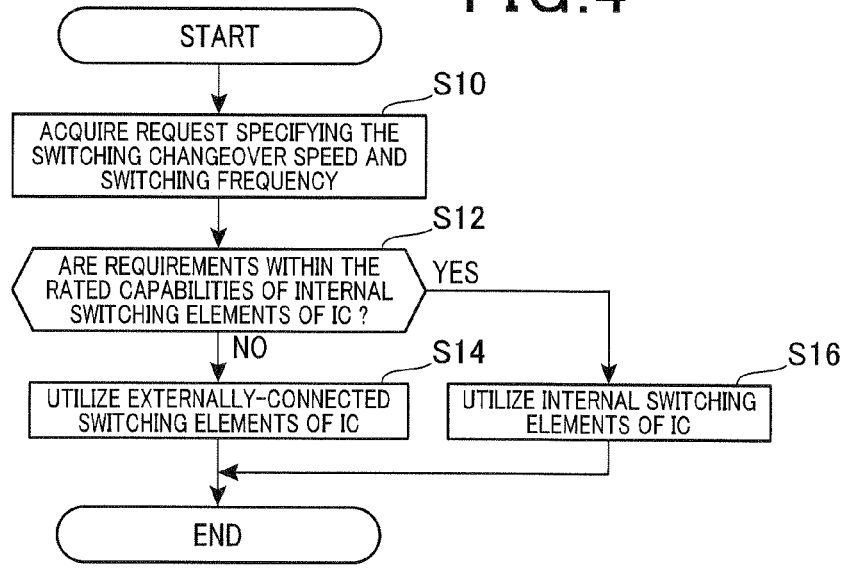
FIG. 4 is a flow diagram of a method of configuring the first embodiment.

FIG. 4 is a flow diagram of a basic procedure for configuring the drive unit DU of this embodiment. Firstly in step S10, request information is acquired which specifies the switching speed and the switching frequency of the driven switching device Sw#. Next in step S12 a decision is made, based on the acquired request information, as to whether the internal switching devices 32 and 42 can be used to pass charging/discharge drive currents to the gate of the switching device Sw#. This decision is made in accordance with whether the rated current values of the switching devices 32 and 42 are above the values required to achieve the specified switching speed, and whether the amount of heat that will be developed within the drive IC 30 during operation at the specified switching frequency will be below an allowable limit value. If there is a NO decision made in step S12, step S14 is then executed in which it is determined that external switching devices (60 and 64) will utilized, and these switching devices are then connected to the drive IC 30 in the configuration shown in FIG. 3. However if there is a YES decision in step S12, step S16 is executed, in which it is determined that internal switching devices (32 and 42) in the drive IC 30 are to be used to pass the charge/discharge currents to the gate of the switching device Sw#, and the configuration of the drive unit DU is left as shown in FIG. 2 above.

The following effects are provided with this embodiment:

(1) If the required levels of drive/discharge current to be supplied to the gate of the switching device Sw# or the switching frequency exceed the rated capabilities of the drive IC 30, external switching devices can be connected to the drive IC 30 for passing the drive currents. These external switching devices are connected to internal switching devices respectively in a Darlington configuration, i.e., the gate of each external switching device is connected to the output terminal (source) of the corresponding internal switching device. Thus the mode of operation of the drive IC 30 is unchanged irrespective of whether or not the external switching devices are utilized, i.e., constant-current control is performed by control signals applied from the output terminals of the operational amplifiers 34, 44 to the gates of the switching devices 32, 42 respectively, for holding the voltage drops across the resistors 22, 42 at constant predetermined values.

Similarly with such a configuration, when the control signal from the output terminal of an operational amplifier (34 or 44) sets the corresponding internal switching device (32 or 42) to the non-conducting state, transfer of drive current through the corresponding charging path is interrupted, irrespective of whether the charging path is via an internal switching device an internal switching device.

(2) The resistors 22 and 24 are connected externally to the drive IC 30. Thus the values of these resistors can readily be adjusted to set required values of charge/discharge current, with the values of voltage drop across each resistor being unchanged irrespective of whether or not the external switching devices 60 and 64 are used.

Second Embodiment

Figure 5:
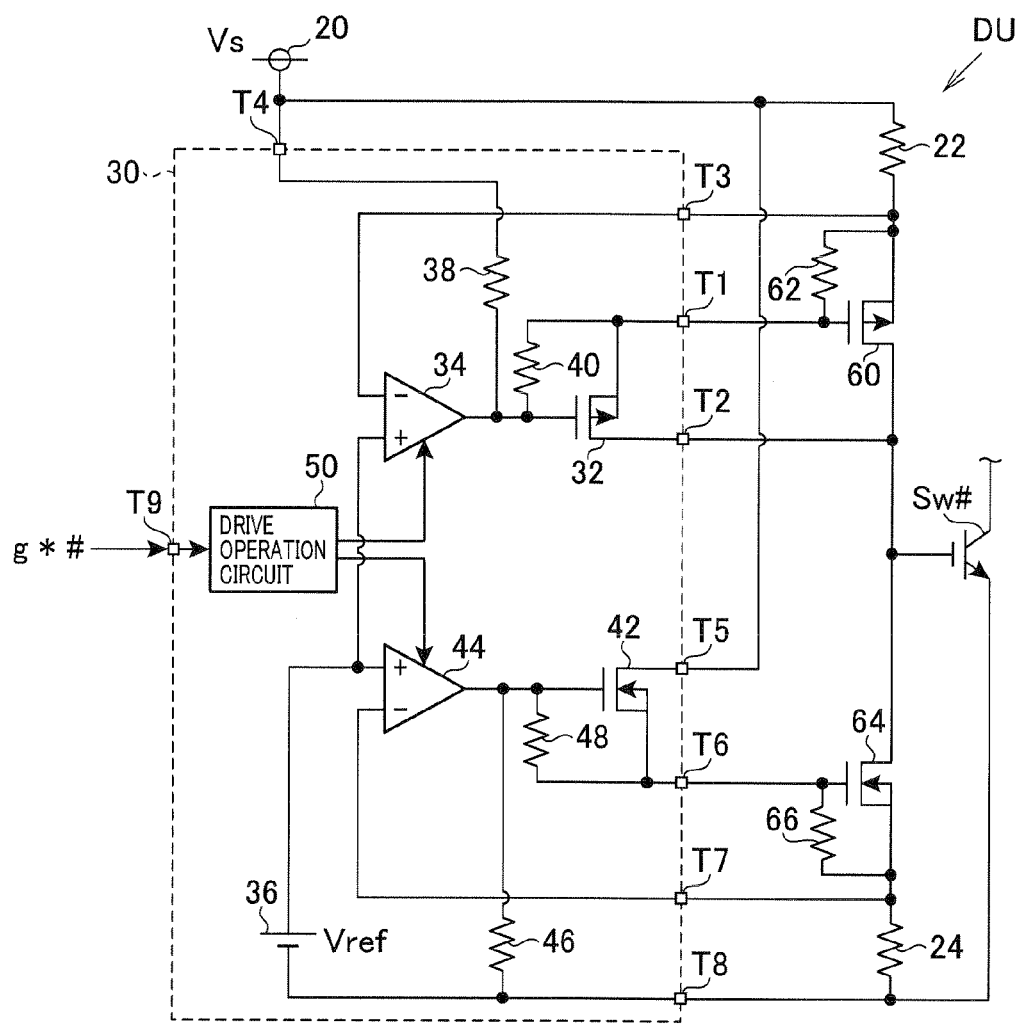
FIG. 5 is a circuit diagram of a second embodiment.

A second embodiment will be described referring to FIG. 5, with the description based on only features which are different from those of the first embodiment. Devices in FIG. 5 corresponding to those of FIG. 2 are indicated by corresponding reference numerals to those of FIG. 2.

With the second embodiment, the drive IC 30 is configured as for the first embodiment. However when external switching devices 60 and 64 are connected to the drive IC 30, a Darlington configuration is used in which the operation-drain of the switching device 32 is connected via terminal T2 to the drain of the switching device 60. The current which flows through the switching device 32 thereby contributes to the stabilized charging current that is supplied to the gate of the switching device Sw#.

Third Embodiment

A third embodiment will be described referring to FIG. 6, with the description based on only features which are different from those of the first embodiment. Devices in FIG. 6 corresponding to those of FIG. 2 above are indicated by corresponding reference numerals to those of FIG. 2.

With the above embodiments, when external switching devices (60, 64) are utilized, control signals are applied to the gates of the external switching devices via the internal switching devices 32 and 42 respectively. However when the switching speed and/or switching frequency of the driven switching element Sw# is high, it may be preferable to apply the control signals (from the output terminals of the operational amplifiers 34, 44) directly to the gates of the external switching devices. This feature is provided by the following embodiment.

Figure 6:
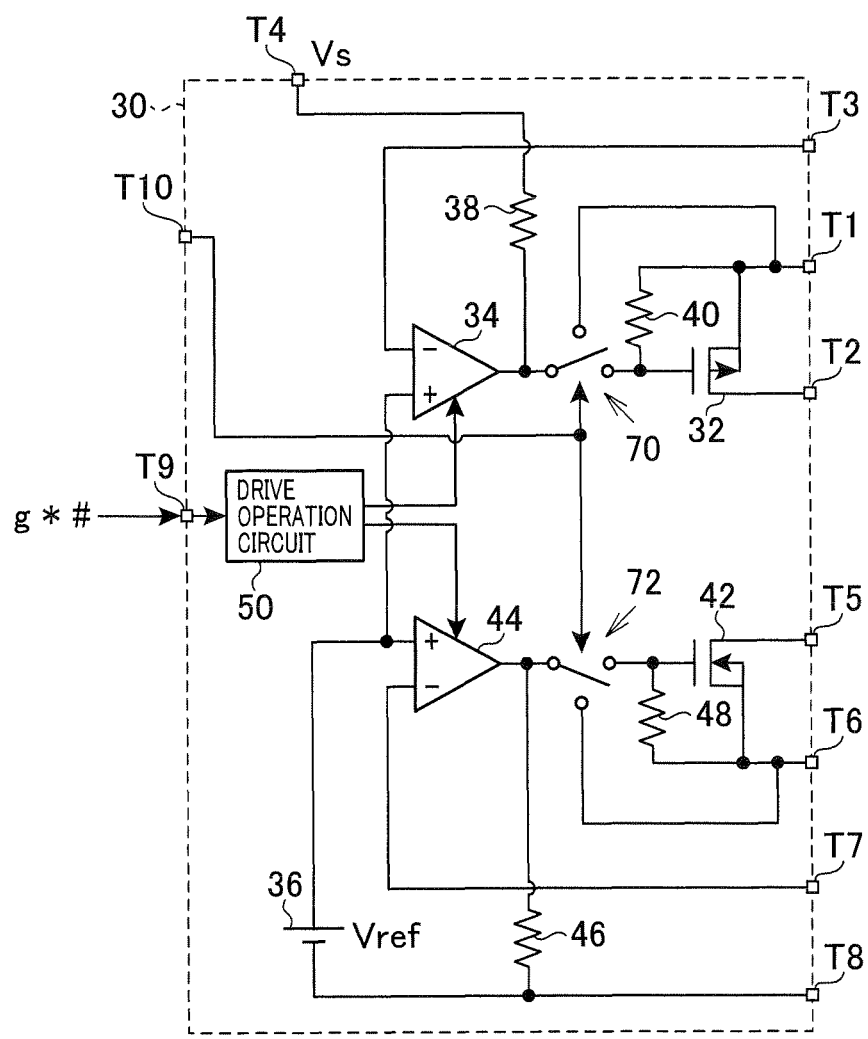
FIG. 6 is a circuit diagram of a third embodiment.

As shown in FIG. 6, the drive IC 30 of this embodiment incorporates an internal changeover circuit 70 (indicated simply as a changeover switch) which is controlled to change between conditions in which the output of the operational amplifier 34 is connected to the gate of the switching device 32 and to terminal T1 of the IC 30, respectively. The drive IC 30 further incorporates an internal changeover circuit 72, which is controlled to perform changeover between conditions in which the output terminal of the operational amplifier 44 is connected to the gate of the switching device 42 and to terminal T6, respectively.

Each of the changeover circuits 70 and 72 is controlled by an externally supplied changeover operation signal which is inputted via a dedicated external input terminal T10 of the drive IC 30. When the output terminals of the operational amplifiers 34 and 44 are connected to the gates of the switching devices 32 and 42 respectively by the changeover circuits 70 and 72, the circuit configuration of the drive IC 30 effectively becomes as shown in FIG. 1 for the first embodiment.

When the changeover circuits 70 and 72 are controlled to connect the output terminals of the operational amplifiers 34 and 44 to the terminals T1 and T6 respectively of the drive IC 30, and the external resistors 22 and 24 and external switching devices 60 and 64 are connected to terminals T1, T3 and T6, T7 of the drive IC 30 as shown in FIG. 3 above, the drive circuit operation becomes similar to that described for FIG. 3. However in this case, control signals are applied (via terminals T1 and T6 respectively) directly to the gates of the switching devices 60 and 64 from the output terminals of the operational amplifiers 34 and 44 respectively, for regulating the charge/discharge currents and for enabling/interrupting these current flows.

The following effect is provided with the third embodiment, in addition to the effect (2) described for the first embodiment:

(3) By providing changeover circuits (70 and 72) which are controlled by an externally supplied changeover signal, applied to a dedicated external input terminal (T10), a drive unit can be readily changed from a configuration appropriate for driving a switching device Sw# which operates at a relatively low switching speed and/or relatively low switching frequency, without using external switching devices (60, 64), to a configuration appropriate for driving a switching device Sw# which operates at a high switching speed and/or high switching frequency, by utilizing external switching devices connected in the drive current charging paths.

Fourth Embodiment

Figure 7:
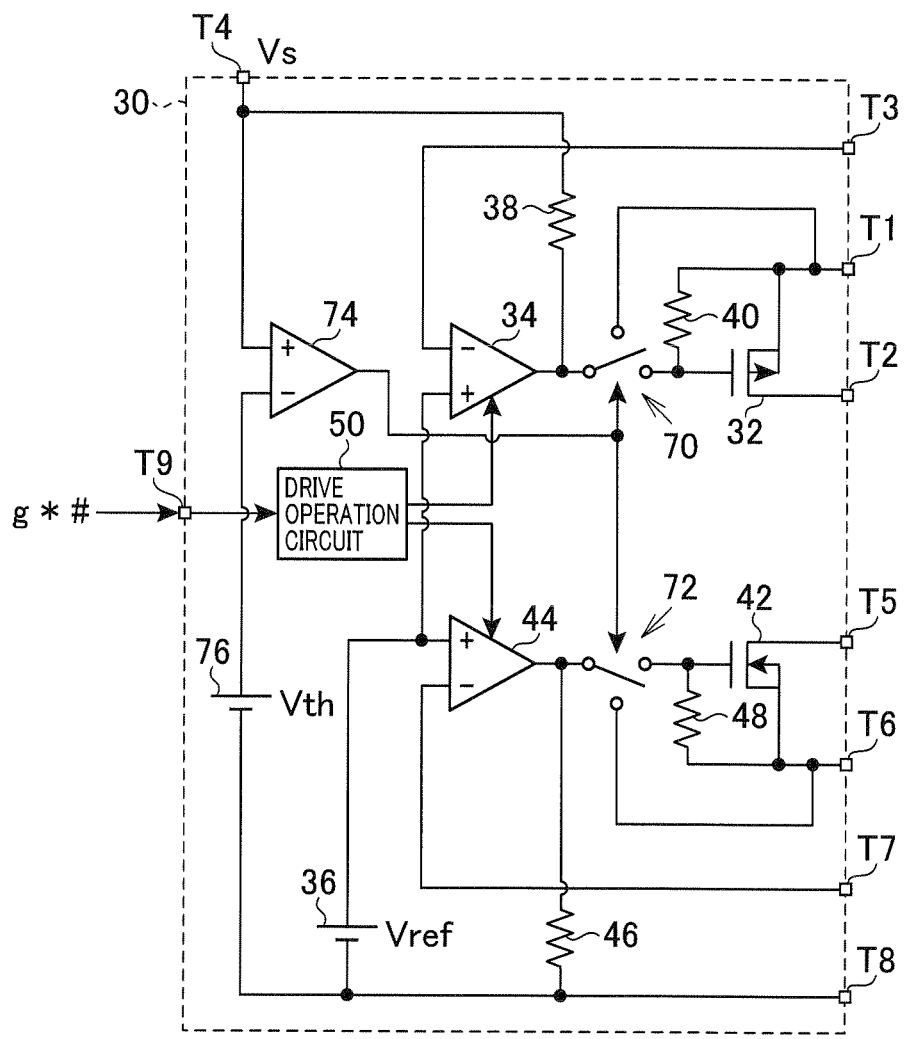
FIG. 7 is a circuit diagram of a fourth embodiment.

A fourth embodiment will be described in the following referring to FIG. 7, with the description based on only features which are different from those of the third embodiment. FIG. 7 shows the drive IC 30 of this embodiment, with devices corresponding to those of FIG. 6 above being indicated by corresponding reference numerals to those of FIG. 6.

With this embodiment the changeover circuits 70 and 72 are controlled based on the value Vs of the supply voltage applied to terminal T4. Specifically, the drive IC 30 of this embodiment incorporates a comparator 74 and a threshold value source 76. The comparator 74 compares the supply voltage Vs with a threshold voltage Vth produced by a threshold value source 76, and the changeover circuits 70 and 72 are operated in accordance with the resultant output signal produced by the comparator 74, i.e., the supply voltage value Vs is predetermined in accordance with whether or not external switching devices (60, 64) are to be utilized.

Various methods may be envisaged for adjusting the supply voltage value Vs to be above or below the threshold voltage Vth, as required for setting the changeover circuits 70 and 72 to a desired condition. For example, the supply voltage source 20 may be implemented as a flyback converter which operates from the low-voltage battery 14 (shown in FIG. 1 above). In that case the supply voltage Vs can be altered by varying the duty ratio at which a switching device of the flyback regulator operates. Alternatively, if the flyback converter includes a series regulator, the value of the supply voltage Vs can be altered by adjusting the series regulator.

The following effect is provided with the fourth embodiment, in addition to the effect (2) described for the first embodiment:

(4) By controlling the operation of the changeover circuits 70 and 72 based on the value of supply voltage that is applied to terminal T4, this control can be performed without requiring an additional terminal (e.g., terminal T10 in FIG. 6) to be provided on the drive IC 30.

Fifth Embodiment

Figure 8:
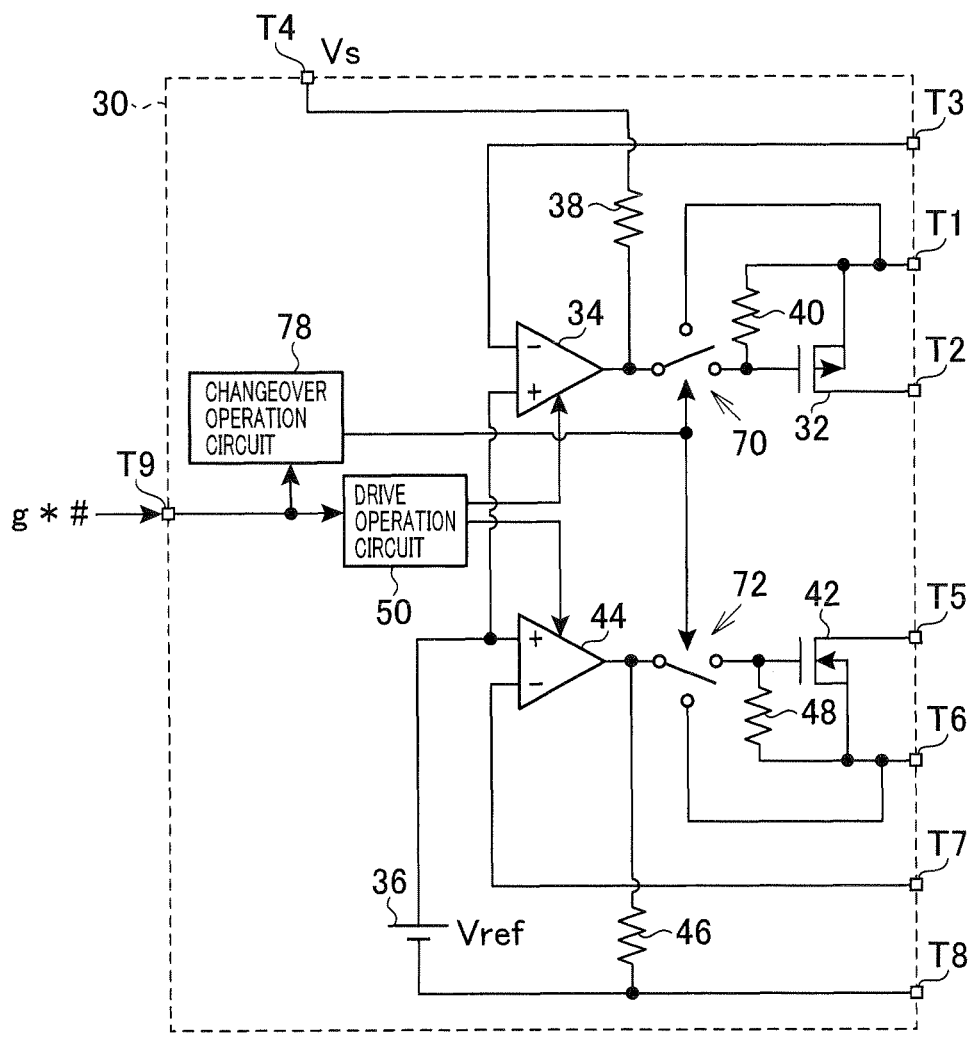
FIG. 8 is a circuit diagram of a fifth embodiment.

A fifth embodiment will be described in the following referring to FIG. 8, showing the drive IC 30 of this embodiment, with the description based on only features which are different from those of the third embodiment. In FIG. 8, devices corresponding to those of FIG. 6 above are indicated by corresponding reference numerals to those of FIG. 6.

With this embodiment as shown in FIG. 8, the drive IC 30 incorporates a changeover operation circuit 78, which controls the operation of the changeover circuits 70 and 72 based on a control signal that is inputted via terminal T9 of the drive IC 30 during an interval of predetermined duration. That interval commences at the point when power begins to be applied to operate the drive IC 30, Normally, the drive operation signal g*# is applied to terminal T9. However during the aforementioned interval (immediately following power switch-on to the drive IC 30), the inverter IV and the converter CV have not yet started to operate. Hence the control signal for setting the conditions of the changeover circuits 70 and 72 can be inputted via terminal T9 and utilized during that interval.

Instead of supplying a signal to the changeover operation circuit 78 only during the aforementioned initial interval, other ways in which the changeover operation circuit 78 utilizes the input terminal T9 could be envisaged. For example, the amount of heat which is generated in the drive IC 30 increases in accordance with increase of the switching frequency at which a switching device Sw# is driven by the drive IC 30. Thus, it would be to configure the changeover operation circuit 78 to detect the switching frequency of the drive operation signal g*#, and to judge whether the frequency exceeds a predetermined threshold value. If the threshold value is exceeded, the changeover operation circuit 78 would control the changeover circuits 70, 72 appropriately for that condition, i.e., for enabling the drive currents to be supplied via external switching devices (60, 64).

The following effect is provided with the fifth embodiment, in addition to the effect (2) described for the first embodiment:

(5) By controlling the operation of the changeover circuits 70 and 72 based on an input signal which is applied via an existing input terminal (i.e., a terminal used also for inputting the drive operation signal g*#), the required number of terminals of the drive IC 30 can be minimized.

Sixth Embodiment

Figure 9:
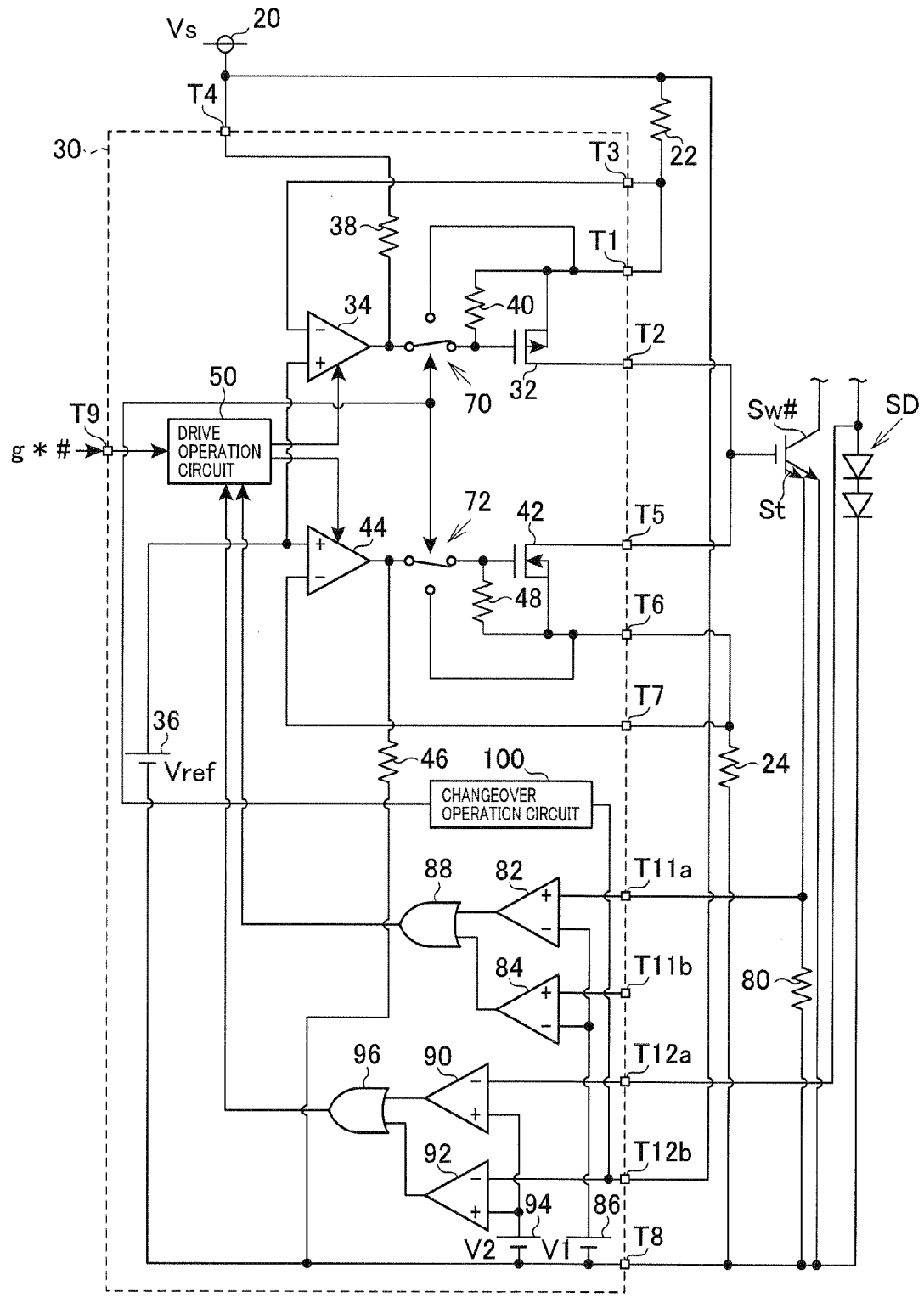
FIGS. 9 and 10 are circuit diagrams of a sixth embodiment, respectively configured without and with external switching devices connected in charging paths.

A sixth embodiment will be described in the following referring to FIG. 9, showing a drive unit DU of this embodiment, with the description based on only features which are different from those of the third embodiment. In FIG. 9, devices corresponding to those of FIG. 6 above are indicated by corresponding reference numerals to those of FIG. 6.

With this embodiment, the drive IC 30 further incorporates external input terminals T11a, T11b, T12a and T12b, reference voltage sources 86 and 94, comparators 82, 84, 90 and 92 and OR gates 88 and 96, with the changeover circuits 70 and 72 being controlled by a changeover operation circuit 100. In addition to the functions described for the third embodiment, the drive IC 30 halts operation of the driven switching device switching device Sw# (or parallel-connected driven switching devices) when the level of current passed by a driven switching device, or its operating temperature, becomes excessively high. Specifically as shown in FIG. 9, a shunt resistor 80 is connected to receive a minute flow of current from a sensing terminal St of the switching device Sw#, with the voltage drop across the shunt resistor 80 being applied to terminal T11a. The level of current from the sensing terminal St is correlated with the level of current flow through the switching device Sw#. A corresponding voltage drop derived for an additional driven switching device may be applied to terminal T11b, and each of these values of voltage drop is compared with a reference voltage V1 from the reference voltage source 86 by the comparators 82 and 84. The value of V1 is equal to that of a voltage drop across the resistor 80 corresponding to a maximum allowable value of current flow through the switching device Sw#.

A signal expressing the logical sum of the output values from the comparators 82 and 84 is obtained by the OR gate 88, and inputted to the drive control circuit 50. The drive control circuit 50 is configured to respond to that signal by halting operation of the operational amplifiers 34, 44 and thereby forcibly setting the switching device Sw# in the off state, when the level of current through the switching device Sw# becomes excessively high. The circuit is preferably configured such that when this condition occurs, the charge stored in the gate of the switching device Sw# is forcibly discharged, however for simplicity of description this is omitted from FIG. 9.

Also as shown in FIG. 9, a temperature sensing diode SD detects the temperature of the switching device Sw# and produces a corresponding output voltage which varies inversely with respect to the temperature of the switching device Sw#, and which is applied to terminal T12a. The input voltage values applied to terminals T12a and T12b are respectively compared with the reference voltage V2 by the comparators 90 and 92. The value of V2 is equal to an output voltage from the sensor diode SD corresponding to a maximum allowable temperature of the switching device Sw#. The logical sum of the outputs from the comparators 90 an 92 is obtained by the 96, and a signal expressing that logical sum is inputted to the drive control circuit 50. The drive control circuit 50 thereby operates such that if either of the input voltages to the terminals T12a, T12b falls below the threshold voltage V2, functioning of the operational amplifiers 34, 44 is halted and the switching device Sw# is thereby forcibly set in the off state. In the condition shown in FIG. 9, the supply voltage Vs (i.e., which is higher than the reference voltage V2) is fixedly applied to terminal T12b.

Figure 10:
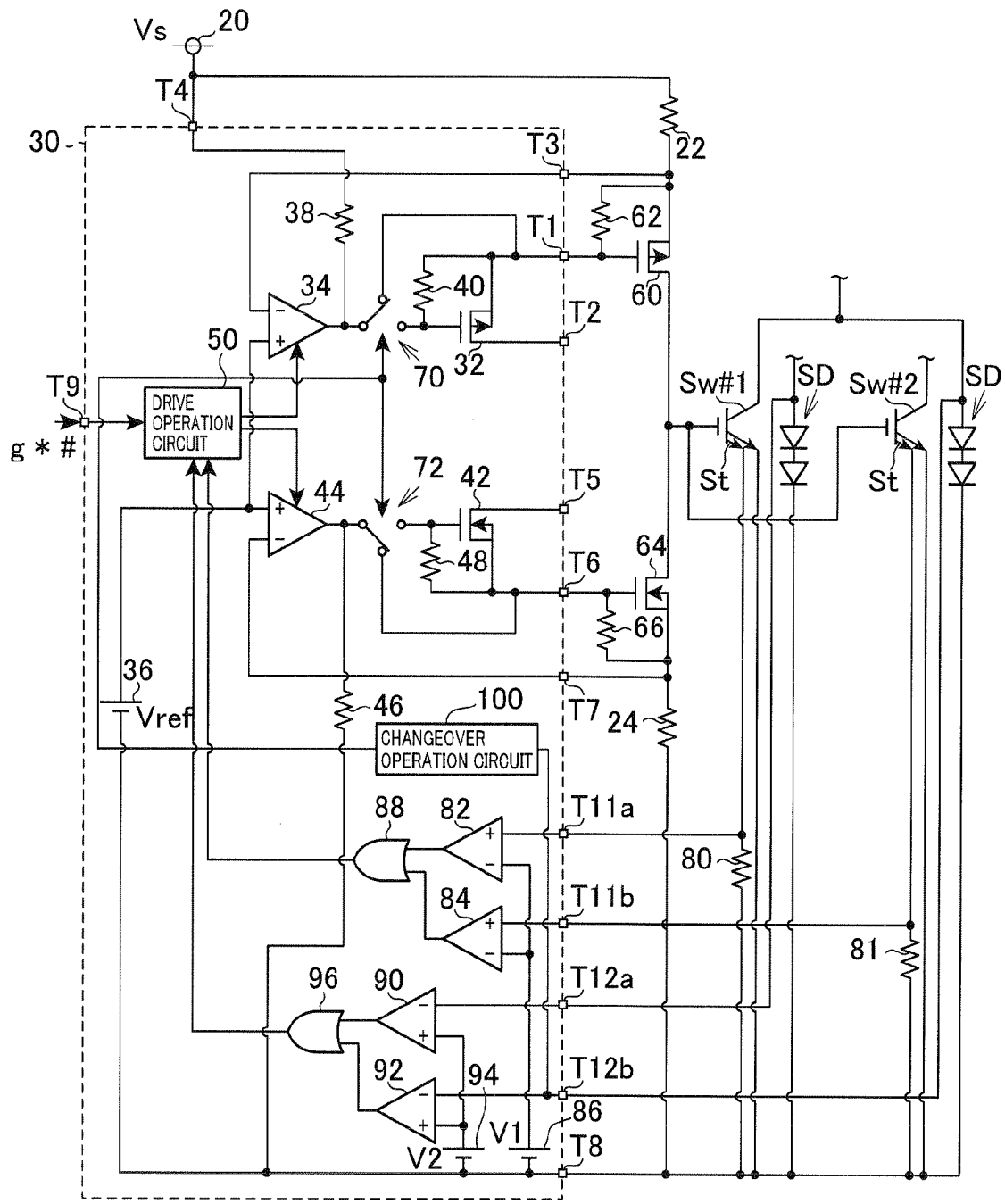

When the drive operation signal g*# is used to drive a pair of parallel-connected driven switching devices S#1, S#2 as illustrated in FIG. 10, a voltage drop (across resistor 81) in accordance with the level of current flow through the second driven switching device S#2 is applied to terminal T11b, while the voltage from a temperature sensing diode of that second driven switching device is applied to terminal T12b, instead of the supply voltage Vs. With that configuration, both of the driven switching devices S#1, S#2 are forcibly set in the off state when the level of current through either of these exceeds the maximum allowable value, or when either of them exceeds the maximum allowable temperature value.

When parallel-connected switching devices such as IGBTs are driven by a drive unit DU, it becomes difficult for the internal switching devices (32, 42) to to supply sufficient charging/discharging drive current, so that it will generally be necessary to connect external switching devices (60, 64) to the drive IC 30. Hence with this embodiment, the changeover operation circuit 100 is configured to judge whether a single driven switching device or parallel-connected driven switching devices are being driven, based upon the voltage value applied to is terminal T12b. When that value is the supply voltage Vs, indicating that only a single driven switching device is connected, the changeover operation circuit 100 sets the changeover circuits 70, 72 as shown in FIG. 9, for supplying the charging/discharging currents to the gate of the switching device Sw# via the internal switching devices 32, 42. When the voltage at terminal T12b is lower than Vs (i.e., is in the range of values produced by a temperature sensing diode), this indicates that parallel-connected switching devices are being driven, as illustrated in FIG. 10. The changeover operation circuit 100 responds by setting the changeover circuits 70, 72 as shown in FIG. 10, for enabling external switching devices (60, 64) to be connected in the charging paths of the gates of the driven switching devices S#1, S#2.

The following effect is provided with the sixth embodiment, in addition to the effect (2) described for the first embodiment:

(5) Since the switches 70 and 72 are operated in accordance with a signal (voltage value) that is applied to an existing terminal (T12b) of the drive IC 30, control of these switches does not require an increase in the number of terminals of the drive IC 30.

Alternative Embodiments

The present invention is not limited to the above embodiments, and various modifications of these embodiments may be envisaged, for example as follows.

Resistors of Constant-Current Circuits

The above embodiments have been described for the case of using two current-determining resistors (22, 24) which are located outside the IC 30. However it may be preferable to dispose a part of each of these resistors internally in the drive IC 30 and constitute the remaining part as an externally connected resistor. The reason for this is as follows. When external switching devices (60, 64) are connected to the drive IC 30, higher values of drive/discharge drive current will be required to be supplied than when only the internal switching devices (32, 42) are utilized. Hence with the above embodiments, it is necessary to reduce the values of the current-determining resistors 22 and 24, if a change is made to utilizing external switching devices. However if each resistor is made up of two parts (one part external to the drive IC 30, the other part formed within the drive IC 30), then these two could be connected in series when only the internal switching devices (32, 42) are used to control the charge/discharge drive currents, while only the internal part would be utilized when external switching devices (60, 64) are connected.

Alternatively to achieve the same effect, only the internal part of each current-determining resistor would be utilized when only the internal switching devices (32, 42) are used, while the two parts would be connected in parallel when external switching devices (60, 64) are connected.

Furthermore, the drive circuit might be required to be applicable to driven switching devices which each require the same values of stabilized charge/discharge current, but which are to be operated at various different switching frequencies. In that case, the decision as to whether to use only the internal switching devices 32, 42 or to also use the external switching devices 60, 64 could be made based on the value of switching frequency, and each of the resistors 22, 24 could be formed entirely within the drive IC 30.

Furthermore, if each of these resistors 22, 24 is formed entirely within the drive IC 30 and it is necessary for the charging/discharging current values to be adjusted, it would be possible to provide external connection terminals on the drive IC 30 for enabling the values of the resistors 22, 24 to be adjusted.

Alternatively for example, the charging current could be adjusted by applying a voltage to the resistor 22 such as to obtain the required value of current while maintaining the voltage drop across the resistor unchanged.

Current Stabilizing Circuits

The invention is not limited to using MOS FETs as the switching devices 32, 42 and 60, 64, i.e., as components of the current stabilizing circuits and for enabling/interrupting drive currents. It would be equally possible to use bipolar transistors etc., for example.

Furthermore it is not essential to use single switching devices for controlling the charging/discharging currents. It would be equally possible to use respective transistor circuits, e.g., in which the base of one bipolar transistor is connected to the collector of a second bipolar transistor, with a resistor connected between collector and base of the first transistor and a resistor connected between the base and emitter of the second transistor.

Furthermore it would be possible to use a current-regulating diode connected in series with a switching device to constitute each stabilized-current circuit.

In that case, it would be possible to perform repetitive on/off switching (i.e., with controlled duty ratio) of the switching device of such a stabilized-current circuit, to control each drive current value, instead of using an operational amplifier. Furthermore in that case, the drive current values (duty ratio of on/off switching) could be determined differently in accordance with whether these switching devices are located internally or external to the integrated circuit of the drive unit. By providing control circuitry within the integrated circuit for controlling the repetitive on/off switching and for controlling enabling/interruption of each stabilized drive current, a wide range of applicability could be achieved.

Type of Driven Switching Device

The invention is not limited in application to driving IGBTs, and would be equally applicable for example to driving P-channel MOS FETs. In that case would be necessary to transfer a discharge current (i.e., decrease a positive charge) from the gate of the driven switching device to set the device in the on state, and to supply a charging current (increase a positive charge) to set the switching device in the off state.

Detection Circuitry for Changeover Between Use of Internal and External Switching Devices With the sixth embodiment above, changeover between configurations is for using the internal switching devices (40, 42) alone and for also using the external switching devices (60, 64) (i.e., control of the changeover circuits 70, 72) is performed based on detecting whether or not an external sensor diode SD (of an additional driven switching device) is connected to a specific terminal (T12b) of the drive IC 30. However for example, it would be equally possible to perform such changeover based on detecting whether or not an external shunt resistor (81) is connected to a specific terminal (T11b) of the drive IC 30, i.e., a shunt resistor for detecting current from the current sensing terminal St of an additional driven switching device.

Other Points

The invention is not limited to a drive circuit which drives a switching device within a power conversion circuit (DC/AC inverter) of a vehicle for supplying a main drive motor of a vehicle. For example, such a drive unit could be applied to a DC/AC inverter which is connected to a high-voltage battery, for operating an air conditioner apparatus of a vehicle.

Furthermore the invention is not limited to being connected to a high-voltage battery, and could be applied to an inverter of a voltage step-up converter which is supplied from a low-voltage battery, for operating an electrically-driven power steering apparatus of a vehicle.

It might be possible to omit the erroneous operation prevention resistors 38 and 46 or to omit the protective resistors 40, 48, 62 and 66, for reducing the number of component parts. In particular, the protective resistors 40, 48 could be omitted by configuring the internal circuits of the operational amplifiers 34 and 44 to perform a protective resistor function.

In the appended claims, it is to be understood that the term "charging" as applied to a drive current is used in a general sense, to signify a current which conveys a positive charge or a current (discharging current) which conveys a negative charge (reduces a positive charge amount).

What is claimed is:

1. A drive circuit for driving a voltage-controlled type of driven switching device, the drive circuit comprising an integrated circuit and including a charging path for supplying a charging current to a control terminal of said driven switching device, wherein said drive circuit comprises a resistor and an external switching device, said resistor connected in series with an input terminal and an output terminal of said external switching device in said charging path, and wherein said integrated circuit comprises:
   an internal switching device connected in a Darlington configuration to said external switching device, and
   a control circuit configured for applying a control signal to a control terminal of said internal switching device, for regulating a voltage drop across said resistor to a predetermined value.

2. A drive circuit according to claim 1, wherein said control circuit is responsive to an externally supplied drive operation signal for controlling said internal switching device to selectively enable and interrupt passage of current through said charging path.

3. A drive circuit according to claim 1, wherein:
   said charging path serves for supplying a positive charge to said control terminal of said driven switching device, and
   an output terminal of said internal switching device is connected to an output terminal of said driven switching device.

4. A drive circuit according to claim 1, wherein:
   said charging path serves for supplying a positive charge to said control terminal of said driven switching device, and
   an output terminal of said internal switching device is connected to said output terminal of said external switching device.

5. A drive circuit according to claim 1, wherein:
   said charging path serves for supplying a negative charge to said control terminal of said driven switching device, and an output terminal of said internal switching device is connected to a control terminal of said external switching device.

6. A drive circuit according to claim 1, wherein at least a part of said resistor is disposed external to said integrated circuit.

7. A drive circuit for driving a voltage-controlled type of driven switching device, the drive circuit comprising an integrated circuit and including a charging path for supplying a charging current to a control terminal of said driven switching device, said integrated circuit including an internal switching device controllable for regulating a value of a current, and
   a control circuit configured to produce a control signal from an output terminal, for selectively enabling and interrupting a flow of said charging current;
   wherein said integrated circuit comprises a changeover circuit responsive to a changeover signal applied to an external input terminal of said integrated circuit for selectively establishing a first connection condition in which said output terminal of said control circuit is connected to an internal element of said integrated circuit for thereby connecting said internal switching device of said integrated circuit into said charging path, and a second connection condition in which said output terminal of the control circuit is connected to an external output terminal of said integrated circuit.

8. A drive circuit according to claim 7, comprising a resistor connected in said charging path, wherein:
   a control terminal of said internal switching device becomes connected to an output terminal of said changeover circuit while said first connection condition is established, and
   said control circuit is configured to regulate a voltage drop across said resistor to a predetermined value.

9. A drive circuit according to claim 8, wherein said external input terminal is dedicated to said changeover operation signal.

10. A drive circuit according to claim 8, wherein:
    said drive circuit is operable for driving a single driven switching device or a plurality of driven switching devices connected in parallel,
    said integrated circuit comprises a plurality of external status detection input terminals dedicated to status detection signals expressing detected status values of respective ones of said plurality of driven switching devices, and
    said integrated circuit comprises a changeover operation circuit configured to judge an input signal condition of a specific one of said external status detection input terminals, and to operate said changeover circuit for connecting said output terminal of said control circuit to said external output terminal of said integrated circuit when it is judged that a status detection signal is being applied to said specific external status detection input terminal.

11. A drive circuit according to claim 8, wherein a value of a power supply voltage applied to a power supply input terminal of said integrated circuit is set to respectively different values in accordance with whether or not said control circuit is required to be connected to said external output terminal, and wherein said integrated circuit comprises a changeover operation circuit configured to operate said changeover circuit based on judging said value of voltage applied to said power supply input terminal.

12. A drive circuit according to claim 8, wherein said external input terminal serves in common for inputting a drive operation signal for commanding said control circuit to effect said enabling and interruption of said drive current and for inputting said changeover operation signal, and wherein integrated circuit comprises a changeover operation circuit configured to operate said changeover circuit in accordance with said changeover operation signal, based on a difference between said drive operation signal and said changeover operation signal.

13. A drive circuit according to claim 12, wherein said changeover operation circuit is configured to operate said changeover circuit in accordance with said changeover operation signal only during an interval of predetermined duration, said interval occurring prior to a commencement of applying said drive operation signal to said external input terminal.

14. A drive circuit according to claim 8, wherein at least a part of said resistor is disposed external to said integrated circuit.

15. A method of manufacturing a drive circuit incorporating an integrated circuit, the drive circuit configured for driving a voltage-controlled type of driven switching device by supplying a charging current through a charging path to charge a control terminal of said driven switching device, the method comprising:
    a formation step of forming an internal switching device and a control circuit in said integrated circuit, said control circuit being operable for controlling said internal switching device to selectively enable and interrupt a flow of said charging current;
    a judgement step of judging whether or not said charging current is to pass via said internal switching device, said judgement being based upon utilization requirements of said driven switching device;
    an external connection step, executed when a negative decision is reached in said judgement step, of
        providing an external switching device outside said integrated circuit, and
        connecting said external switching device to said control terminal of the driven switching device and to said integrated circuit such as to establish said charging path as a path via said external switching device; and
    an internal connection step, executed when an affirmative decision is reached in said judgement step, of connecting said internal switching device to said control terminal of said driven switching device such as to establish said charging path as a path via said internal switching device.

16. A method according to claim 15, further comprising a resistor connected in a flow path of said charging current, wherein:
    said control circuit is configured to produce control signal for controlling a voltage drop across said resistor to a predetermined value.

17. A method according to claim 15, wherein:
    said internal switching device and said external switching device comprise respective transistor devices, and
    when said charging path is to be established via said external switching device, said internal switching device is connected to said external switching device in a Darlington configuration.

18. A method according to claim 15, further comprising a resistor connected in series in said charging path, wherein said formation step applied to said integrated circuit comprises steps of:
    forming said control circuit such as to regulate a voltage drop across said resistor to a predetermined value,
    forming a changeover circuit, controllable for effecting changeover between connecting an output terminal of said control circuit to a control terminal of said internal switching device and to a control terminal of said external switching device, and forming a changeover operation circuit configured to operate said changeover circuit in accordance with a signal applied to an external input terminal of said integrated circuit.

* * * * *